(12) United States Patent
Lim et al.

(10) Patent No.: US 7,326,964 B2
(45) Date of Patent: Feb. 5, 2008

(54) LIGHT EMITTING DIODE PACKAGE WITH PROTECTIVE FUNCTION AGAINST ELECTROSTATIC DISCHARGE

(75) Inventors: Chang Hyun Lim, Seoul (KR); Woong Lin Hwang, Kyungki-do (KR); Seog Moon Choi, Seoul (KR); Ho Joon Park, Seoul (KR); Sung Jun Lee, Seoul (KR); Sang Hyun Choi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 62 days.

(21) Appl. No.: 11/312,365

(22) Filed: Dec. 21, 2005

(65) Prior Publication Data

US 2006/0214181 A1    Sep. 28, 2006

(30) Foreign Application Priority Data

Mar. 23, 2005   (KR) ..................... 10-2005-0024297

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2006.01) |
| *H02H 3/20* | (2006.01) |
| *H02H 9/04* | (2006.01) |
| *H02H 3/00* | (2006.01) |
| *H02H 7/00* | (2006.01) |
| *H02H 9/02* | (2006.01) |

(52) U.S. Cl. ................... 257/79; 361/91.5; 361/102

(58) Field of Classification Search ................ 257/100, 257/79, 84, 415; 361/91.5, 102
See application file for complete search history.

(56) References Cited

U.S. PATENT DOCUMENTS

| | | |
|---|---|---|
| 6,861,677 B2 | 3/2005 | Chen |
| 2004/0160173 A1* | 8/2004 | Shen et al. .................. 313/506 |

OTHER PUBLICATIONS

Rebiez, Gabriel M. and Muldavin, Jeremy B. Dec. 2001. "RF MEMS Switches and Switch Circuits", IEEE Microwave Magazine, vol. 2 issue 4, pp. 59-71.*

* cited by examiner

*Primary Examiner*—Anh Phung
*Assistant Examiner*—Allison P Bernstein
(74) *Attorney, Agent, or Firm*—McDermott Will & Emery LLP

(57) ABSTRACT

An LED package having an MEMS switch operated by electrostatic force, capable of continuously protecting an LED from excessive current due to electrostatic discharge. The LED package includes a submount with first and second electrode patterns formed thereon; an LED mounted on the submount, having an n-electrode electrically connected to the first electrode pattern and a p-electrode electrically connected to the second electrode pattern; and an MEMS switch including a first conductive plate and a second conductive plate bent to have an area over and vertically apart from the first conductive plate, wherein the first and second conductive plates are electrically connected to the first and second electrode patterns, and the second conductive plate comes in contact with the first conductive plate by electrostatic force upon being applied with voltage higher than a predetermined level of voltage.

9 Claims, 2 Drawing Sheets

(a)

(b)

path of over-current by electrostatic discharge

LIGHT EMITTING DIODE PACKAGE WITH PROTECTIVE FUNCTION AGAINST ELECTROSTATIC DISCHARGE

CLAIM OF PRIORITY

This application claims the benefit of Korean Patent Application No. 2005-24297 filed on Mar. 23, 2005, in the Korean Intellectual Property Office, the disclosure of which is incorporated herein by reference.

BACKGROUND OF THE INVENTION

1. Field of the Invention

The present invention relates to a Light Emitting Diode (LED) package capable of preventing damage to an LED due to electrostatic discharge, and more particularly, to an LED package having a protective function against electrostatic discharge, in which a Micro Electro Mechanical Systems (MEMS) switch operable to electrostatic force is provided to continuously protect an LED from excessive current due to electrostatic discharge.

2. Description of the Related Art

Having superior physical and chemical properties, a nitride semiconductor using nitride such as GaN has become popular as core material for photoelectric material and electric devices recently. Particularly, the nitride semiconductor light emitting device is capable of generating a range of light including green, blue and ultraviolet ranges, and with its luminance rapidly enhanced by the recent technological development, it has been extensively applied to the fields such as all-natural color electric bulletin boards and illumination apparatuses.

In general, a nitride semiconductor light emitting device has a disadvantage in that it is very vulnerable to static electricity compared with the semiconductors composed of other compounds such as GaP or GaAlAs. For example, the nitride semiconductor light emitting device can be destroyed by constant voltage in forward direction of about hundreds of volts (100V or higher), and also by constant voltage in backward direction of about tens of volts (30V or higher). Such vulnerability to constant voltage can be a cause of damage to the LED when handling the nitride semiconductor light emitting device. Therefore, various researches have been conducted to overcome the vulnerability of the nitride semiconductor light emitting device to static electricity. In relation to this, U.S. Pat. No. 6,861,677 (entitled "Package of Light Emitting Diode with Protective Element," assigned to United Epitaxy Co., Ltd.) discloses an LED package having a combined structure of a nitride semiconductor light emitting device and a Zener diode on a single substrate.

FIG. 1(a) illustrates the conventional LED package disclosed in U.S. Pat. No. 6,861,677. With reference to FIG. 1(a), in the LED package 10 disclosed in U.S. Pat. No. 6,861,677, an n-electrode 111 is connected to a p-electrode 121 of the Zener diode 12 through a conductive bump 151, and a p-electrode 112 of an LED 11 is connected to a conductive heat-radiation structure 14 through another conductive bump 152, and the conductive heat-radiation structure 14 and the n-electrode 122 of the Zener Diode 12 are adhered to a substrate 13 for electrical connection.

The structure of the conventional LED package 10 described above has a circuit structure as shown in FIG. 1(b). That is, an anode of the LED 11 is connected to a cathode of the Zener diode 12, and a cathode of the LED 11 is connected to an anode of the Zener diode 12 in parallel. Therefore, when both electrodes of the LED 11 are applied with backward voltage, then the Zener diode 12 becomes applied with forward voltage, thereby current runs through the Zener diode 12, not through the LED 11. In addition, in case when forward voltage is applied to both electrodes of the LED, if voltage lower than the breakdown voltage of the Zener diode 12 is applied, current runs through the LED 11, and light emission takes place. If forward voltage higher than the breakdown voltage of the Zener diode 12 is applied, the Zener diode 12 breaks down, allowing all currents to run through the Zener diode 12. Therefore, the conventional LED package uses the Zener diode 12 to prevent current by excessive voltage applied forward and backward by static electricity from running through the LED 11, thereby preventing damage to the LED due to static electricity.

However, the conventional LED package which protects the LED from electrostatic discharge uses the Zener diode 12, and thus once excessive current has run through the Zener diode 12, the Zener diode 12 can no longer be operated, no longer performing the protective function against electrostatic discharge. In other words, the conventional LED package having a protective function against electrostatic discharge can perform the protection function only once, and cannot perform repeatedly, and thus the LED remains vulnerable to the exposure to excessive current due to electrostatic discharge.

SUMMARY OF THE INVENTION

The present invention has been made to solve the foregoing problems of the prior art and it is therefore an object of the present invention to provide an LED package capable of continuously protecting an LED from excessive current due to electrostatic discharge.

According to an aspect of the invention for realizing the object, there is provided a Light Emitting Diode (LED) package having a protective function from electrostatic discharge comprising: a submount with first and second electrode patterns formed thereon; an LED mounted on the submount, having an n-electrode electrically connected to the first electrode pattern and a p-electrode electrically connected to the second electrode pattern; and an MEMS switch including a first conductive plate disposed on the submount and a second conductive plate disposed apart from the first conductive plate on the submount and bent to have an area over and vertically apart from the first conductive plate, wherein the first conductive plate is electrically connected to one of the first and second electrode patterns, and the second conductive plate is electrically connected to the other electrode pattern, and the second conductive plate comes in contact with the first conductive plate by electrostatic force upon being applied with voltage higher than a predetermined level of voltage.

In a preferred embodiment of the present invention, the submount comprises a silicon substrate and a $SiO_2$ film formed on the silicon substrate. Using the silicon substrate for the submount allows application of Micro Electro Mechanical System (MEMS) process, thereby allowing integral formation of MEMS switch with the submount without additional step of separately producing the MEMS switch to attach on the submount. That is, in case of using the silicon substrate for the submount, the first and second conductive plates may be integrally formed with the submount. In the mean time, since a silicon substrate is conductive, it is preferable to form a $SiO_2$ film on the silicon substrate to form a plurality of electrodes necessary for electrical insulation.

In an embodiment of the present invention, in order to electrically connect the two conductive plates with the first and second electrode patterns, the submount may further comprise conductive patterns formed on the submount, electrically connecting the first conductive plate to one of the first and second electrode patterns and electrically connecting the second conductive plate to the other electrode pattern.

In an embodiment of the present invention, it is preferable that the first and second conductive plates are made of metal, and particularly preferable made of Al. In addition, the resilient second conductive plate may be made of polysilicon. It is preferable that the predetermined level of voltage that makes the first conductive plate and the second conductive plate come in contact with each other by electrostatic force is up to 30V.

In addition, an embodiment of the present invention may further comprise a reflector formed around the LED on the submount for reflecting the light emitted from the LED upward.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
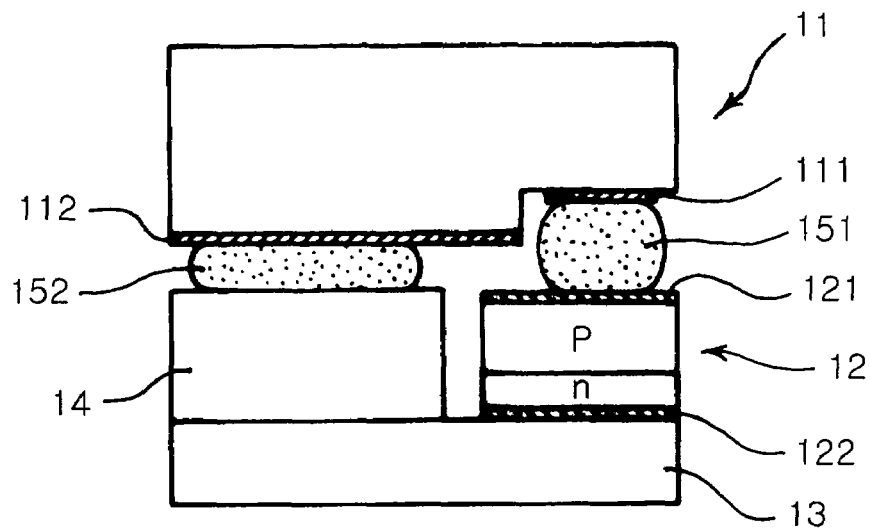
FIG. 1(a) is a sectional view illustrating a conventional LED package having a protective function against electrostatic discharge.
FIG. 1(b) is a circuit diagram of the conventional LED package shown in FIG. 1(a)
Figure 1:
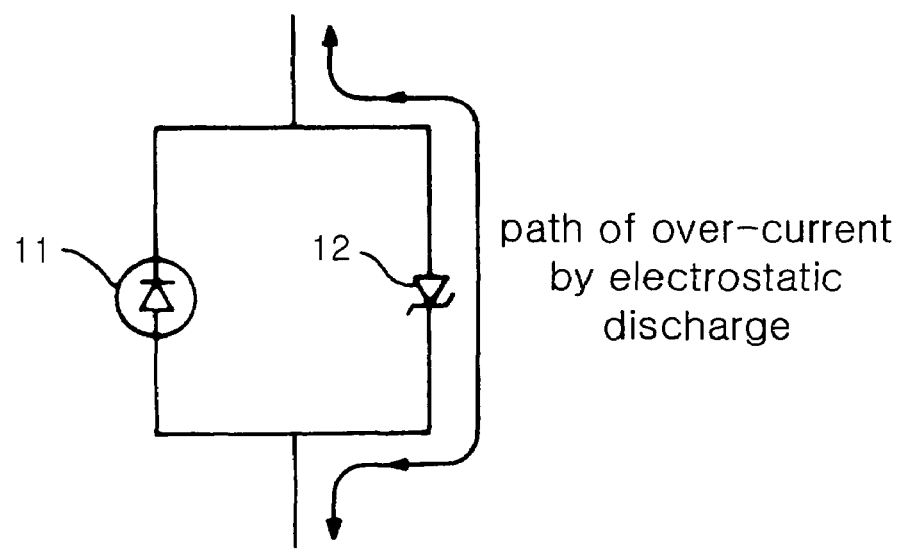

Preferred embodiments of an LED package having a protective function against electrostatic discharge of the present invention will now be described in detail with reference to the accompanying drawings.

The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

Figure 2:
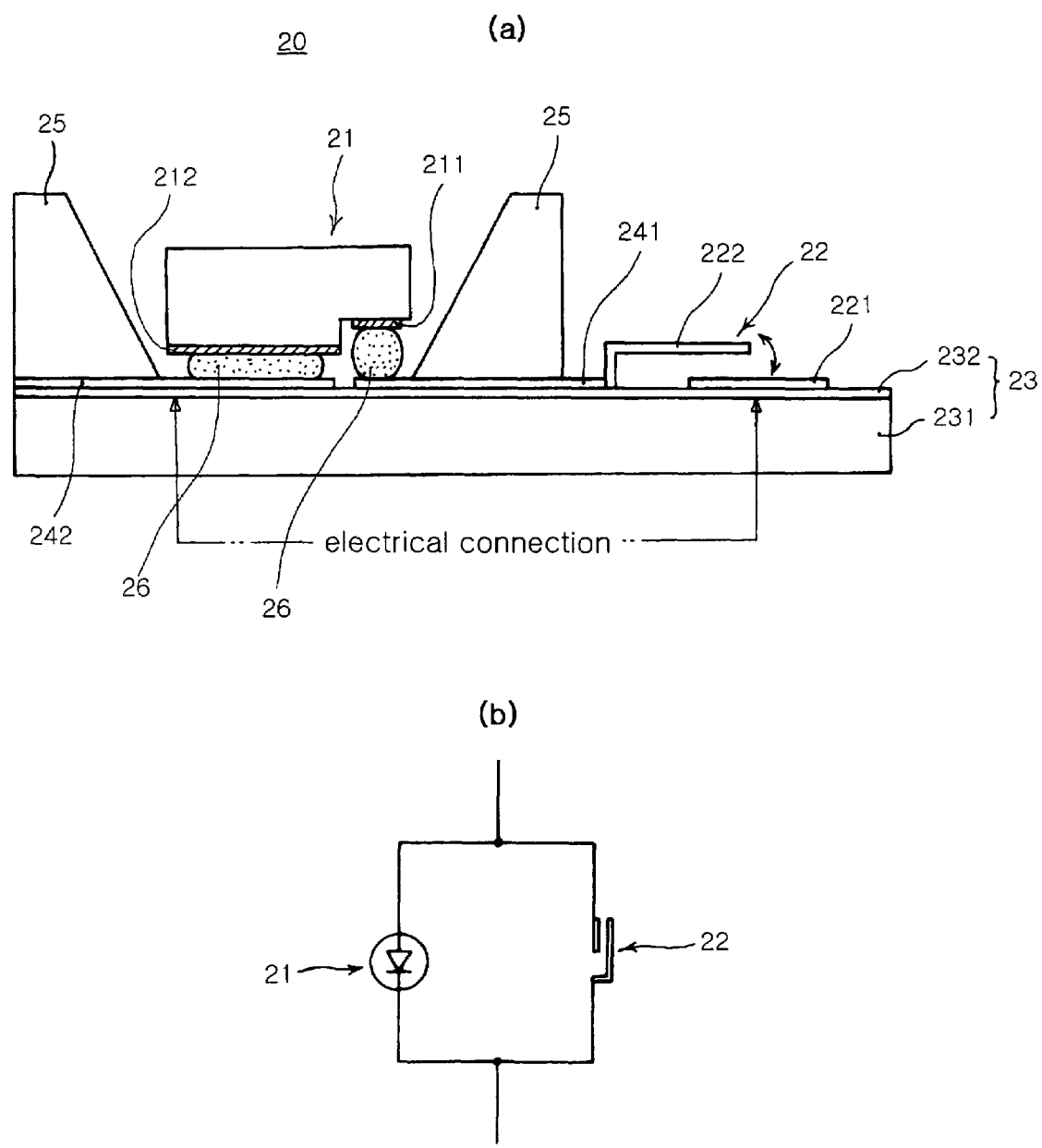
FIG. 2(a) is a sectional view illustrating an LED package having a protective function against electrostatic discharge according to the present invention.
FIG. 2(b) is a circuit diagram of the LED package of the present invention shown in FIG. 2(a).

FIG. 2(a) is a sectional view illustrating an LED package having a protective function against electrostatic discharge according to an embodiment of the present invention.

Referring to FIG. 2(a), the LED package according to an embodiment of the present invention includes a submount 23 with first and second electrode patterns 241 and 242 formed thereon; an LED 21 mounted on the submount 23, having an n-electrode 211 and a p-electrode 212 electrically connected to the first and second electrode patterns 241 and 242, respectively; and a Micro Electro Mechanical System (MEMS) switch 22 including a first conductive plate 221 disposed on the submount and a second conductive plate 222 having resilience disposed apart from the first conductive plate 221 on the submount and bent to have an area over and vertically apart from the first conductive plate 221. The first conductive plate 221 is electrically connected to one of the first and second electrode patterns 241 and 242, and the second conductive plate 222 is electrically connected to the other electrode pattern.

The LED package of this embodiment further includes a reflector formed around the LED 21, reflecting light emitted from the LED 21 upward.

The LED can include not only nitride semiconductor LEDs such as GaN, but also other compounds of LEDs such as GaP or GaAlAs.

FIG. 2(a) illustrates an example of a nitride semiconductor LED such as GaN, but this does not mean that the present invention is limited to nitride semiconductor LEDs. Typically, a nitride semiconductor LED is fabricated using an insulation substrate such as a sapphire substrate that satisfies lattice matching for crystal growth, and thus has a horizontal structure in which a p-electrode 212 and an n-electrode 211, connected to p-type and n-type nitride semiconductor layers, respectively, are horizontally disposed on the upper surface of a light emission structure. Needless to say, the nitride semiconductor LED can also have a vertical structure in which a conductive substrate such as SiC is used and a p-electrode and an n-electrode are formed on the upper and lower surfaces of the LED, respectively, but the present invention explains with an example of a nitride semiconductor LED having the horizontal structure.

In case of adopting a nitride semiconductor LED having the horizontal structure, the n-electrode 211 and the p-electrode 212 of the nitride semiconductor LED may be connected to a first electrode pattern 211 and a second electrode pattern 212, respectively, on a submount 23 using conductive bumps 26 in a flip-chip structure. The flip-chip bonding does not use wires and thus can reduce light loss due to use of wires, and the flip-chip bonding is more preferable than the wire bonding using metal wires since the flip-chip bonding can discharge heat generated from the LED more easily.

The submount 23 is used as a supporting structure for supporting the LED 21 and the MEMS switch 22. On the upper surface of the submount 23, a first electrode pattern 241 and a second electrode pattern 242 can be formed as well as conductive patterns (not shown) for connecting the first and second conductive plates 221 and 222 of the MEMS switch to the first and second electrode patterns. In this case, the first conductive plate 221 can be connected to the first electrode pattern 241, and the second conductive plate 222 can be connected to the second electrode pattern 241, and alternatively, the first conductive plate 221 with the second electrode pattern 242, and the second conductive plate 242 with the first electrode pattern 241.

Preferably, the submount 23 can include a silicon substrate 231 and a $SiO_2$ film 232 formed on the silicon substrate 231. The $SiO_2$ film 232 can be formed on the surface of the silicon substrate 231 by thermally treating the silicon substrate in an oxygen atmosphere.

If a silicon substrate 231 is used for the submount 23, an MEMS process can be applied, and thus the MEMS switch 22 can be integrally formed with the submount 23. That is, the MEMS process can be used to integrally form the first conductive plate 221 and the second conductive plate 222 of the MEMS switch 22 with the submount 23. Therefore, an extra procedure in which a separate MEMS switch 22 is made and attached on the submount 23 can be omitted, which is an advantage in terms of process. In the meantime, since the silicon substrate 231 is conductive, it is preferable that a SiO$_2$ film 232 is formed on the silicon substrate 231 to provide a plurality of electrodes thereon which need electrical insulation.

The MEMS switch 22 is made using an MEMS process, and includes a first conductive plate 221 and a second conductive plate 222. The first conductive plate 221 and the second conductive plate 222 have a vertically overlapping area, and a partial area of the second conductive plate is disposed over and apart from the first conductive plate 221.

FIG. 2(a) illustrates an example in which the second conductive plate 222 is connected to the first electrode pattern 241, and the first conductive plate 221 is connected to the second electrode pattern 242, but it is acceptable also to connect the first conductive plate 221 with the first electrode pattern 241, and the second conductive plate 222 with the second electrode pattern 242.

In addition, FIG. 2(a) illustrates a structure in which one end of the second conductive plate 222 is fixed on the submount 23, and is bent so that a partial area of the second conductive plate 222 is disposed over the first conductive plate 221. The second conductive plate 222 is resilient so that the part disposed over the first conductive plate 221 can be moved up and down. Thereby, in case when voltage higher than a predetermined level of voltage is applied between the first electrode pattern 241 and the second electrode pattern 242, the second conductive plate 222 comes in contact with the first conductive plate 221 by electrostatic force, being electrically connected ('on' state). In case when no voltage is applied between the first electrode pattern 241 and the second electrode pattern 242, or voltage less than the predetermined level of voltage is applied, the first conductive plate 221 and the second conductive plate 222 stay apart or opened ('off' state).

The first and second conductive plates 221 and 222 may be made of metal, or preferably, of Al. In addition, the resilient second conductive plate 222 can be made of polysilicon.

In the present invention, it is preferable that the predetermined level of voltage is lower than the minimum voltage that can damage the LED. For example, if the LED is damaged by constant voltage of about 100V in forward direction and about 30V in backward direction, it is preferable that the predetermined level of the MEMS switch is set up to 30V, and more preferably, set up to 20V.

The predetermined level of voltage of the MEMS switch 22 may be adjusted to a desired value by adjusting the elastic modulus of the second conductive plate 222, the interval between the first conductive plate 221 and the second conductive plate 222, and the area of the overlapped part between the first conductive plate 221 and the second conductive plate 222.

In addition, the switching time of the MEMS switch 22 is determined by the magnitude of the voltage applied. As higher voltage is applied, the switching time of the MEMS switch 22 is decreased.

The MEMS switch 22 of the present invention can adopt diverse structures of MEMS switch known in the art, and is not limited to the structure shown in FIG. 2(a).

The present embodiment is provided with a reflector 25 which is formed around the LED 21 on the submount, reflecting the light emitted from the LED upward. The reflector 25 may be formed in a shape of wall surrounding side surfaces of the LED 21, and the inner wall surface of the reflector adjacent to the side part of the LED 21 forms a slope such that the light emitted to sides of the LED 21 is reflected upward, enhancing luminance and straightness of the light emitted from the LED package.

FIG. 2(b) is a diagram of the equivalent circuit of the LED package according to the embodiment of the present invention described above. Referring to FIG. 2(b), an anode (p-electrode 212 in FIG. 2(a)) of the LED 21 is electrically connected to the first conductive plate (221 in FIG. 2(a)), and a cathode (n-electrode 211 in FIG. 2(a)) is electrically connected to the second conductive plate (222 in FIG. 2(a)) of the MEMS switch 22 in parallel. The connection arrangement between the LED 21 and the first and second conductive plates may be altered between each other.

Therefore, as high voltage due to static electricity is applied between the two electrodes of the LED 21 in forward or backward direction, the first conductive plate and the second conductive plate of the MEMS switch 22 become electrically connected ('on') by electrostatic force, and thereby, all currents run through the MEMS switch 22, thus preventing the damage to the LED 21 due to high current.

The conventional Zener diode cannot be reused for electrostatic discharge protection once excessive current due to electrostatic discharge runs therethrough. On the contrary, as high voltage due to static electricity is removed, the first conductive plate and the second conductive plate return by resilience to respective positions, apart in an interval, so that when high voltage due to static electricity is applied again later, the MEMS switch 22 in the present invention can repeatedly protect the LED from electrostatic discharge.

As set forth above, the LED package having a protective function against electrostatic discharge uses the MEMS switch to prevent excessive current due to static electricity applied to the LED, thereby repeatedly protecting the LED from electrostatic discharge.

Moreover, according to the present invention, a silicon substrate is used for the submount, so that the MEMS switch is integrally formed with the submount, which makes possible the omission of the process of attaching the MEMS switch that is made separately, facilitating miniaturization of the package.

While the present invention has been shown and described in connection with the preferred embodiments, it will be apparent to those skilled in the art that modifications and variations can be made without departing from the spirit and scope of the invention as defined by the appended claims.

What is claimed is:

1. A Light Emitting Diode (LED) package having a protective function against electrostatic discharge comprising:
   a submount with first and second electrode patterns formed thereon;
   an LED mounted on the submount, having an n-electrode electrically connected to the first electrode pattern and a p-electrode electrically connected to the second electrode pattern; and
   an MEMS switch including a first conductive plate disposed on the submount and a second conductive plate disposed apart from the first conductive plate on the submount and bent to have an area over and vertically apart from the first conductive plate, wherein the first conductive plate is electrically connected to one of the first and second electrode patterns, and the second conductive plate is electrically connected to the other electrode pattern, and the second conductive plate comes in contact with the first conductive plate by electrostatic force upon being applied with voltage higher than a predetermined level of voltage.

2. The LED package according to claim 1, wherein the submount comprises a silicon substrate and a SiO₂ film formed on the silicon substrate.

3. The LED package according to claim 2, wherein the first and second conductive plates are integrally formed with the submount, and electrically connected to the first and second electrode patterns, conductive patterns on the submount, respectively.

4. The LED package according to claim 1 or 3, wherein the submount further comprises conductive patterns formed on the submount, electrically connecting the first conductive plate to one of the first and second electrode patterns and electrically connecting the second conductive plate to the other electrode pattern.

5. The LED package according to claim 1, wherein the first and second conductive plates are made of metal.

6. The LED package according to claim 5, wherein the first and second conductive plates are made of Al.

7. The LED package having according to claim 1, wherein the second conductive plate is made of poly-silicon.

8. The LED package according to claim 1, wherein the predetermined level of voltage is up to 30V.

9. The LED package according to claim 1, further comprising a reflector formed around the LED on the submount for reflecting the light emitted from the LED upward.

* * * * *